United States Patent
Tabei et al.

(10) Patent No.: US 8,221,645 B2
(45) Date of Patent: Jul. 17, 2012

(54) HEAT DISSIPATING MATERIAL AND SEMICONDUCTOR DEVICE USING SAME

(75) Inventors: Shingo Tabei, Tokyo (JP); Chisato Hoshino, Tokyo (JP)

(73) Assignee: Momentive Performance Materials Japan LLC, Tokyo (JP)

( * ) Notice: Subject to any disclaimer, the term of this patent is extended or adjusted under 35 U.S.C. 154(b) by 0 days.

(21) Appl. No.: 13/240,695

(22) Filed: Sep. 22, 2011

(65) Prior Publication Data

US 2012/0007017 A1   Jan. 12, 2012

Related U.S. Application Data

(63) Continuation of application No. 12/161,659, filed as application No. PCT/JP2007/051132 on Jan. 25, 2007.

(30) Foreign Application Priority Data

Jan. 26, 2006 (JP) .................. 2006-018017

(51) Int. Cl.
*C09K 5/00* (2006.01)
*F28F 21/00* (2006.01)

(52) U.S. Cl. ............... 252/78.3; 106/287.13; 106/185

(58) Field of Classification Search .............. 524/261
See application file for complete search history.

(56) References Cited

U.S. PATENT DOCUMENTS

| | | |
|---|---|---|
| 3,844,992 A | 10/1974 | Antonen |
| 4,801,642 A | 1/1989 | Janik et al. |
| 4,842,911 A | 6/1989 | Fick |
| 4,852,646 A | 8/1989 | Dittmer et al. |
| 5,008,307 A | 4/1991 | Inomata |
| 5,021,494 A | 6/1991 | Toya |
| 5,186,849 A | 2/1993 | Toya et al. |
| 5,221,339 A | 6/1993 | Takahashi et al. |
| 5,227,081 A | 7/1993 | Sawa et al. |
| 5,276,087 A | 1/1994 | Fujiki et al. |
| 5,530,060 A | 6/1996 | Fujiki et al. |
| 5,548,038 A | 8/1996 | Enami et al. |
| 5,929,138 A | 7/1999 | Mercer et al. |
| 5,962,601 A | 10/1999 | Hiroji et al. |
| 5,969,023 A | 10/1999 | Enami et al. |
| 6,001,914 A | 12/1999 | Faccio et al. |
| 6,031,025 A | 2/2000 | Mercer et al. |
| 6,114,429 A | 9/2000 | Yamada et al. |
| 6,174,841 B1 | 1/2001 | Yamada et al. |
| 6,255,257 B1 | 7/2001 | Yamada et al. |
| 6,306,957 B1 | 10/2001 | Nakano et al. |
| 6,372,337 B2 | 4/2002 | Takahashi et al. |
| 6,380,301 B1 | 4/2002 | Enami et al. |
| 6,531,771 B1 | 3/2003 | Schoenstein et al. |
| 6,818,600 B2 | 11/2004 | Yamada et al. |
| 2003/0170446 A1 | 9/2003 | Takahashi et al. |
| 2003/0180484 A1 | 9/2003 | Imai et al. |
| 2003/0195124 A1 | 10/2003 | Yamada et al. |
| 2004/0097628 A1 | 5/2004 | Sekiba |
| 2004/0106717 A1 | 6/2004 | Asaine |
| 2006/0135687 A1 | 6/2006 | Fukui |
| 2006/0270788 A1 | 11/2006 | Ozai et al. |

FOREIGN PATENT DOCUMENTS

| | | |
|---|---|---|
| EP | 0 469 419 A2 | 7/1992 |
| EP | 0 727 462 A2 | 8/1996 |
| EP | 1 352 947 A1 | 10/2003 |
| EP | 1 375 623 A1 | 1/2004 |
| JP | 5-105814 A | 4/1993 |
| JP | 10-189838 A | 7/1998 |
| JP | 11-140322 A | 5/1999 |
| JP | 2002-294269 A | 10/2002 |
| JP | 2003-301189 A | 10/2003 |
| JP | 2004-363272 A | 12/2004 |
| JP | 3676544 B2 | 5/2005 |
| JP | 2005-206761 A | 8/2005 |
| WO | WO 02/081592 A1 | 10/2002 |
| WO | WO 2004/072181 A2 | 8/2004 |

OTHER PUBLICATIONS

S. Tabei, U.S. PTO Office Action, U.S. Appl. No. 12/161,659, dated Aug. 30, 2010, 7 pages.
S. Tabei, U.S. PTO Office Action, U.S. Appl. No. 12/161,659, dated Jan. 21, 2011, 7 pages.
S. Tabei, U.S. PTO Office Action, U.S. Appl. No. 12/161,659, dated Jun. 28, 2011, 8 pages.
S. Tabei, U.S. PTO Notice of Allowance, U.S. Appl. No. 12/161,659, dated Feb. 6, 2012, 5 pages.

*Primary Examiner* — Robert S Loewe
(74) *Attorney, Agent, or Firm* — Foley & Lardner LLP

(57) ABSTRACT

Disclosed is a heat dissipating material which is interposed between a heat-generating electronic component and a heat dissipating body. This heat dissipating material contains (A) 100 parts by weight of a silicone gel cured by an addition reaction having a penetration of not less than 100 (according to ASTM D 1403), and (B) 500-2000 parts by weight of a heat conductive filler. Also disclosed is a semiconductor device comprising a heat-generating electronic component and a heat dissipating body, wherein the heat dissipating material is interposed between the heat-generating electronic component and the heat dissipating body.

3 Claims, 1 Drawing Sheet

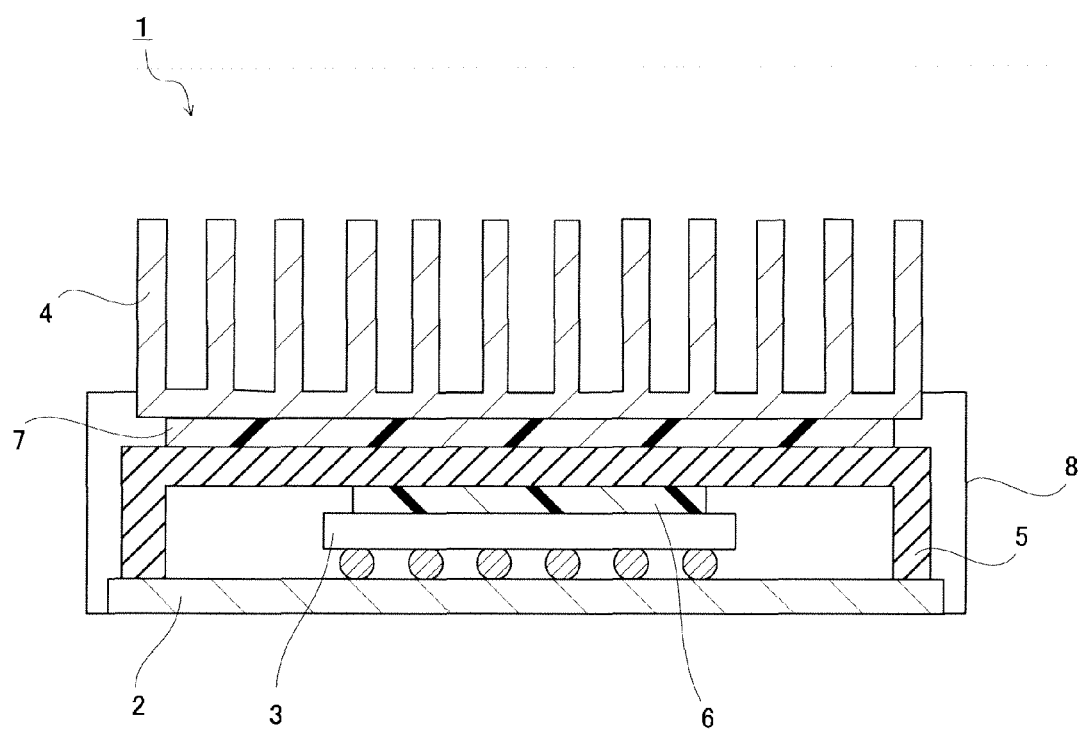

HEAT DISSIPATING MATERIAL AND SEMICONDUCTOR DEVICE USING SAME

CROSS-REFERENCE TO RELATED APPLICATIONS

The present application is a Continuation of U.S. application Ser. No. 12/161,659, filed Jul. 21, 2008, which is based upon PCT National Stage Application No. PCT/JP2007/051132 filed Jan. 25, 2007, and claims the benefit of priority from prior Japanese Patent Application No. 2006-018017, filed Jan. 26, 2006, and the entire contents of each of these applications are incorporated herein by reference.

TECHNICAL FIELD

The present invention relates to a heat dissipating material that is excellent in thermal conductivity and not prone to oil bleeding and to a semiconductor device which has the heat dissipating material interposed between a heat-generating electronic component and a heat dissipating body.

BACKGROUND ART

Conventionally, a heat dissipating body such as a heat sink is widely used for many of heat-generating electronic components in order to prevent damage, performance degradation and the like due to an increase in temperature during use. For efficient conduction of the heat generated from the heat-generating electronic component to the heat dissipating body, a heat conductive material is used between the heat-generating electronic component and the heat dissipating body.

It is known to use a heat dissipating sheet or a heat dissipating grease for the heat conductive material. Generally, heat dissipating grease has properties similar to a liquid, and compared to heat dissipating sheets, can adhere tightly to the heat-generating electronic component and the heat dissipating body to decrease interfacial thermal resistance without being influenced by surface irregularities of the heat-generating electronic component and the heat dissipating body. However, the heat dissipating grease tends to bleed oil component when used for an extended period.

For example, Patent Reference 1 proposes a heat dissipating silicone grease having a heat conductive filler contained in a base oil of a particular polyorganosiloxane. Patent Reference 2 proposes a heat dissipating material which contains polyorganosiloxane having a vinyl group bonded to a silicon atom, polyorganohydrogensiloxane having a hydrogen atom bonded to a silicon atom and a heat conductive filler, and is gelated by a cross-linking reaction in the presence of a platinum based catalyst.

It is generally known that such a conventional heat dissipating material has the heat conduction performance improved by high filling of the heat conductive filler. However, since the conventional heat dissipating material tends to cause lowering of workability in the production process, the upper limit of its blending amount is restricted. Therefore, due to the further increase in heat generation resulting from recent trends of higher densities and performance of heat-generating electronic components, a sufficient heat conduction effect cannot be obtained by the conventional heat dissipating material. Furthermore, oil bleeding is not reduced sufficiently, allowing free oil component to bleed from a gel-like cured material due to external pressures such as swaging or the like, and electronic parts are easily contaminated. The contamination tends to prevent the achievement of the original performance of the electronic parts or to cause them to operate poorly.

Patent Reference 1: JP-A 2003-301189 (KOKAI)
Patent Reference 2: JP-A 2002-294269 (KOKAI)

DISCLOSURE OF THE INVENTION

According to an aspect of the present invention, there is provided a heat dissipating material excelling in thermal conductivity and not prone to oil bleeding and a semiconductor device using the same.

The present inventors have made various studies to achieve the above object and consequently achieved the present invention by finding that a heat dissipating material, which is obtained with a heat conductive filler dispersed into a matrix, exerts excellent thermal conductivity and is not prone to oil bleeding when an addition-cured silicone gel with a crosslink density adjusted and flexibility after curing controlled is used as the matrix, and a semiconductor device using the same can be obtained.

An aspect of the present invention is a heat dissipating material, comprising: (A) 100 parts by weight of a silicone gel cured by an addition reaction having a penetration (ASTM D1403, ¼ cone) of not less than 100; and (B) 500 to 2000 parts by weight of a heat conductive filler, wherein the heat dissipating material is interposed between a heat-generating electronic component and a heat dissipating body.

Another aspect of the present invention is a semiconductor device, comprising a heat-generating electronic component and a heat dissipating body with the heat dissipating material according to the aspect of the present invention interposed between the heat-generating electronic component and the heat dissipating body.

The silicone gel according to the present invention means a cured material of a low crosslink density partially having a three-dimensional network structure. It is clearly distinguished from a rubber-like elastic material on the point that it has a rubber hardness value zero according to JIS A Hardness, namely such low hardness not having effective rubber hardness, and a penetration of not less than 100 according to ASTM D 1403 (¼ cone).

By configuring as described above, it is possible to provide a heat dissipating material excelling in thermal conductivity and not prone to oil bleeding and a semiconductor device using the same.

BRIEF DESCRIPTION OF DRAWING

FIG. 1 is a sectional view showing an example of the semiconductor device according to an embodiment of the present invention.

BEST MODE FOR CARRYING OUT THE INVENTION

The best mode of carrying out the present invention will be described below. It is to be noted that the present invention is not limited to the following embodiments.

The heat dissipating material according to an embodiment of the present invention comprises (A) a silicone gel cured by an addition reaction having a penetration (ASTM D1403, ¼ cone) of not less than 100 and (B) a heat conductive filler.

The component (A) the silicone gel cured by an addition reaction is used as a matrix of a heat dissipating material, which is a component providing the heat dissipating material which is not prone to production of oil bleeding. The component (A) is created by curing an addition-curable silicone gel composition containing (A1) polyorganosiloxane having an average of 0.1 to 2 alkenyl groups, the alkenyl group being bonded to a silicon atom, within each molecule, (A2) polyorganohydrogensiloxane having two or more hydrogen atoms, the hydrogen atom being bonded to a silicon atom, within each molecule and (A3) a platinum based catalyst.

A component used as the component (A1) is represented by an average composition formula:

$$R^1_a R^2_b SiO_{[4-(a+b)]/2}.$$

In the formula, $R^1$ represents an alkenyl group. The number of carbon atoms of the alkenyl group is preferably in a range of 2 to 8, and examples thereof are a vinyl group, an allyl group, a propenyl group, a 1-butenyl group, a 1-hexenyl group and the like, and more preferably a vinyl group. The alkenyl group is contained in an average of 0.1 to 2, and preferably an average of 0.5 to 1.8 in each molecule. When the alkenyl group is less than an average of 0.1, polyorganosiloxane molecules which do not contribute to the cross-linking reaction become too many, and it is hard to prepare a gel. Meanwhile, when they exceed an average of 2, (A) a silicone gel cured by an addition reaction (gel-like cured material) becomes too hard to obtain a desired penetration (a penetration of not less than 100 according to ASTM D 1403, ¼ cone). And, the alkenyl group may be bonded to a silicon atom at the terminal of the molecular chain, the silicon atom in the molecular chain, or both, but it is preferably bonded to at least the silicon atom at the terminal of the molecular chain, and particularly to the silicon atoms at both terminals of the molecular chain in view of the curing rate of the addition-curable silicone gel composition, the physical properties of the created (A) silicone gel cured by an addition reaction (gel-like cured material), and particularly flexibility.

$R^2$ is a substituted or unsubstituted monovalent hydrocarbon group not having an aliphatic unsaturated bond. $R^2$ has 1 to 12 carbon atoms, and preferably 1 to 10 carbon atoms, and examples are an alkyl group such as a methyl group, an ethyl group, a propyl group, an isopropyl group, a butyl group, a hexyl group, an octyl group, a decyl group or a dodecyl group; a cycloalkyl group such as a cyclopentyl group, a cyclohexyl group or a cyclobutyl group; an aryl group such as a phenyl group, a tolyl group, a xylyl group or a naphthyl group; an aralkyl group such as a benzyl group, a phenylethyl group or a phenylpropyl group; and a group which has part or all of the hydrogen atoms substituted by a halogen atom such as a chlorine, fluorine or bromine atom, a cyanogen group or the like, and examples are a halogenated hydrocarbon group such as a chloromethyl group, a trifluoropropyl group, a chlorophenyl group, a bromophenyl group, a dibromophenyl group, a tetrachlorophenyl group, a fluorophenyl group or a difluorophenyl group, and a cyanoalkyl group such as an α-cyanoethyl group, a β-cyanopropyl group or a γ-cyanopropyl group. Among them, the alkyl group and the aryl group are preferable, and the methyl group and the phenyl group are more preferable.

Also in the formula, a and b are positive numbers satisfying 0<a<3, 0<b<3 and 1<a+b<3. They are preferably 0.0005≦a≦1, 1.5≦b<2.4 and 1.5<a+b<2.5, and more preferably 0.001≦a≦0.5, 1.8≦b≦2.1 and 1.8<a+b≦2.2.

The molecular structure of the component (A1) may be any of linear, branched, cyclic and three-dimensional networks (resin like) or a mixture thereof.

The component (A1) preferably has a viscosity of 0.1 to 10 Pa·s at 23° C. When the viscosity is less than 0.1 Pa·s, the (A) silicone gel cured by an addition reaction (gel-like cured material) having good physical properties cannot be obtained and tends to become brittle. When it exceeds 10 Pa·s, workability tends to be degraded.

The component (A2) polyorganohydrogensiloxane is a cross-linking agent and has two or more hydrogen atoms (SiH group) that the hydrogen atom is bonded to the silicon atom within each molecule. The hydrogen atom may be bonded to the silicon atom at the terminal of the molecular chain, the silicon atom in the molecular chain, or both. The molecular structure may be any of linear, branched chain, cyclic and three-dimensional networks, and may consist of them or a mixture of two or more of them.

The component (A2) is represented by an average composition formula:

$$R^3_c H_d SiO_{[4-(c+d)]/2}.$$

In the formula, $R^3$ represents a substituted or unsubstituted monovalent hydrocarbon group excepting an aliphatic unsaturated hydrocarbon group. Examples of $R^3$ include an alkyl group such as a methyl group, an ethyl group, a propyl group, an isopropyl group, a butyl group, an isobutyl group, a tert-butyl group, a hexyl group, a cyclohexyl group or an octyl group; an aryl group such as a phenyl group or a tolyl group; an aralkyl group such as a benzyl group or a phenylethyl group; and a group which has part or all of the hydrogen atoms in these groups substituted by a halogen atom such as a chlorine, fluorine or bromine atom, or a cyano group, and examples are a chloromethyl group, a bromoethyl group, a trifluoropropyl group, and a cyanoethyl group. Among them, an alkyl group having 1 to 4 carbon atoms is preferable, and a methyl group is more preferable from and ease of synthesis and cost perspective.

In the formula, c and d are numerals satisfying 0.5≦c≦2, 0<d≦2 and 0.5<c+d≦3, and preferably 0.6≦c≦1.9, 0.01≦d≦1.0 and 0.6≦c+d≦2.8.

The component (A2) preferably has a viscosity of 0.01 to 0.5 Pa·s at 23° C.

The blending amount of the component (A2) is an amount such that the total number of hydrogen atoms bonded to the silicon atoms becomes 0.3 to 1.5, and preferably 0.4 to 1.2 to one alkenyl group bonded to the silicon atoms of the component (A1). When it is less than 0.3, the degree of cross-linking becomes insufficient, and it is hard to obtain the (A) silicone gel cured by an addition reaction (gel-like cured material). When it exceeds 1.5, it is hard to obtain the (A) silicone gel cured by an addition reaction (gel-like cured material) having a desired penetration (a penetration of not less than 100 according to ASTM D 1403, ¼ cone), and furthermore, the physical properties tend to vary with time.

The component (A3) platinum based catalyst is a component for accelerating the curing of the composition. As the component (A3), a known catalyst used for hydrosilylation reaction can be used. Examples include platinum black, platinum chloride, chloroplatinic acid, a reactant of chloroplatinic acid and monohydric alcohol, a complex of chloroplatinic acid and an olefin or vinylsiloxane, platinum bisacetoacetate and the like.

The blending amount of the component (A3) is an amount that is adequate for curing and can be adjusted according to a desired curing rate or the like. Generally, it preferably falls in a range of 1 to 100 ppm to the total amount of the addition-curable silicone gel composition in platinum element equivalent.

The components (A1) to (A3) described above are determined as basic components, and a reaction inhibitor may be added as an optional component in order to maintain appropriate curing reactivity and storage stability. Examples of the reaction inhibitor are acetylenic alcohols such as 3,5-dimethyl-1-hexyn-3-ol, 2-methyl-3-hexyn-2-ol and 1-ethynyl-1-cyclohexanol, 3-methyl-3-pentene-1-yne, 3,5-dimethyl-3-hexene-1-yne, or a methylvinylsiloxane cyclic compound, an organic nitrogen compound, an organic phosphorus compound and the like. The blending amount of the reaction inhibitor is in a range such that the properties of the (A) silicone gel cured by an addition reaction (gel-like cured material) are not deteriorated, and preferably 0.01 to 1 part by weight to 100 parts by weight of the component (A1).

For example, the component (A) silicone gel cured by an addition reaction, can be produced by mixing the above-described components (A1) to (A3) and the reaction inhibitor as an optional component by a mixer such as a planetary mixer, a kneader or a Shinagawa mixer to obtain the addition-curable silicone gel composition, and heating the mixture at 60 to 150 degrees C. for 30 to 180 minutes to cure.

The penetration (ASTM D1403, ¼ cone) of the obtained component (A) is not less than 100, preferably not less than 120, and more preferably 120 to 220 to suppress oil bleeding at the time when the (B) heat conductive filler is blended with the component (A) to use as a heat dissipating material and to obtain good physical conformity to the heat-generating electronic component and the heat dissipating body. The component (A) has flexibility at a degree that a viscosity cannot be substantially measured by a rotational viscometer.

The component (B) is desired to be good in thermal conductivity, and its examples include inorganic powder such as aluminum oxide, zinc oxide, silicon oxide, silicon carbide, silicon nitride, magnesium oxide, aluminum nitride, boron nitride or graphite, and powder of metal such as aluminum, copper, silver, nickel, iron or stainless steel. One of them or a mixture of two or more of them may be used.

It has an average particle diameter of 0.1 to 100 μm, and preferably 0.1 to 80 μm. When the average particle diameter is less than 0.1 μm, the desired unworked penetration for a heat dissipating material (200 to 450 at 23° C.) is difficult to obtain. Meanwhile, if the average particle diameter exceeds 100 μm, the heat dissipating material tends to have poor stability. The average particle diameter can be determined by, for example, a laser diffraction method. Its shape may be either spherical or amorphous.

The blending amount of the component (B) is 500 to 2000 parts by weight, and preferably 600 to 1500 parts by weight to 100 parts by weight of the component (A). If the blending amount is less than 500 parts by weight, the desired thermal conductivity of at least 1.0 W/(m·K) cannot be obtained. When it exceeds 2000 parts by weight, workability is degraded.

If necessary, to the above-described components (A) and (B) used as the basic components, a flame retardancy providing agent, a heat resistance improving agent, a plasticizer, a coloring agent, an adhesion providing agent and the like may be added as optional components in an amount not impairing the object of the present invention.

As a method of producing the heat dissipating material according to an embodiment of the present invention, there is, for example, a method of mixing the components (A) and (B) and the optional components by a mixer such as a planetary mixer, a kneader, a Shinagawa mixer or the like. The (B) heat conductive filler can be added to mix with the previously addition-reacted (A) addition-curable silicone gel to prevent variations in the heat dissipating characteristics due to the sedimentation of the component (B). The obtained heat dissipating material has grease-like properties and extensibility. When it is coated, the surfaces of the heat-generating electronic component and the heat dissipating body are firmly adhered without being affected by the irregularities of the surfaces, and the interfacial thermal resistance can be reduced.

The unworked penetration of the heat dissipating material according to the present invention is preferably 200 to 450. The unworked penetration is indicated by a value according to JIS K 2220. When the unworked penetration exceeds 450 at 23° C., sagging tends to occur when coated. When it is less than 200, it is difficult to discharge and to have desired thickness when coated on a heat-generating electronic component by, for example, a syringe or a dispenser.

The heat dissipating material according to the present invention has a thermal conductivity of 1.0 W/(m·K) or more, and preferably 1.5 W/(m·K) or more, at 23° C. when measured by a hot wire method. When the thermal conductivity is less than 1.0 W/(m·K), the heat conduction performance might become insufficient, and usage tends to be limited.

The heat dissipating material according to the present invention exerts thermal conductivity and also excellent low bleeding property, so that it is suitable as a heat conductive material to be interposed between the heat-generating electronic component and the heat dissipating body.

The semiconductor device according to an embodiment of the present invention is described with reference to the drawing. FIG. 1 is a sectional view showing an example of the semiconductor device according to the embodiment of the present invention.

As shown in FIG. 1, a semiconductor device 1 has a heat-generating electronic component such as a CPU 3 mounted on a wiring board 2 and a heat dissipating body such as a heat sink 4. The CPU 3 is covered with a heat spreader 5, and in this package is placed, for example, a known heat conductive material such as a heat dissipating gel 6 between the heat spreader 5 and the CPU 3. Outside the package, a heat dissipating material 7, which is in a grease state, according to the above-described embodiment of the present invention is interposed between the heat spreader 5 and the heat sink 4. Use of the heat dissipating material 7 outside the package can provide excellent thermal conductivity and good workability.

The semiconductor device 1 is produced as follows. First, the heat dissipating gel 6 is coated on the CPU 3, which is mounted on the wiring board 2, by a syringe or the like, and the package is assembled and heated. The heat dissipating material 7 which is in a grease state is coated on the heat spreader 5 by a syringe or the like, and the heat sink 4 and the wiring board 2 are pressed by a clamp 8 or screws. Here, the heat dissipating material 7 is used outside (between the heat spreader 5 and the heat sink 4) of the package but not limited to such an use and may also be used within (between the heat spreader 5 and the CPU 3) the package. When it is used within the package, contamination of the CPU 3 and the like can be prevented and reliability can be improved because it has low bleeding properties.

It is preferable that the heat dissipating material 7 interposed between the CPU 3 and the heat sink 4 has a thickness of 5 to 300 μm. When the thickness of the heat dissipating material 7 is less than 5 μm, there is a possibility of producing, for example, a gap between the heat spreader 5 and the heat sink 4 because of slight deviations in pressure. When the thickness is greater than 300 μm, the heat resistance increases, and the heat dissipating effect tends to be degraded.

The present invention is described below with reference to examples, but the present invention is not limited to the examples. In each of Examples and Comparative Examples, a viscosity is indicated by a value obtained by measuring at 23° C. And, an average particle diameter indicates a value measured by a laser diffraction method. The heat dissipating material obtained in Examples and Comparative Examples were evaluated as follows and the results are shown in Table 1. The properties shown in Table 1 are indicated by values obtained by measuring at 23° C.

[Unworked Penetration]

It was measured according to JIS K 2220.

[Thermal Conductivity]

It was measured according to a hot wire method by a thermal conductivity meter (QTM-500 produced by KYOTO ELECTRONICS MANUFACTURING CO., LTD.).

[Oil Bleeding Distance]

The obtained heat dissipating material was weighed for 0.1 g, which was then placed on a commercially available filter paper and put in an oven at 105° C. The presence of oil bleeding around the heat dissipating material was measured for its length after one day, 10 days, 20 days and 30 days.

Preparation Example 1

(A1) 100 parts by weight of polydimethylsiloxane having a viscosity of 0.7 Pa·s and an average of one vinyl group positioned at only the terminal of the molecular chain, (A2) 0.4 part by weight (SiH group content of 8.8 mmol/g, SiH of (A2)/SiVi of (A1)=0.7) of a trimethylsilyl group-blocked dimethylsiloxane/methylhydrogensiloxane copolymer having a viscosity of 0.015 Pa·s, (A3) 0.02 part by weight (4 ppm as platinum amount) of a vinylsiloxane complex compound (platinum amount: 1.8%) of chloroplatinic acid, 0.02 part by weight of 3,5-dimethyl-1-hexyn-3-ol, and 0.2 part by weight of triarylisocyanurate were added to a universal kneader and mixed homogeneously. Further mixing was conducted at 150 degrees C. for one hour to obtain (A-1) a silicone gel cured by an addition reaction (an addition-cured silicone gel). The obtained (A-1) addition-cured silicone gel was found to have a penetration of 200 when measured using a ¼ cone according to ASTM D1403. Its viscosity could not be measured by a rotational viscometer (produced by SHIBAURA SYSTEMS CO., LTD.).

Preparation Example 2

(A1) 100 parts by weight of polydimethylsiloxane having a viscosity of 0.7 Pa·s and an average of one vinyl group positioned at only the terminal of the molecular chain, (A2) 0.6 part by weight (SiH group content of 8.8 mmol/g, SiH of (A2)/SiVi of (A1)=1.1) of a trimethylsilyl group-blocked dimethylsiloxane/methylhydrogensiloxane copolymer having a viscosity of 0.015 Pa·s, (A3) 0.02 part by weight (4 ppm as platinum amount) of a vinylsiloxane complex compound (platinum amount: 1.8%) of chloroplatinic acid, 0.02 part by weight of 3,5-dimethyl-1-hexyn-3-ol, and 0.2 part by weight of triarylisocyanurate were added to a universal kneader and mixed homogeneously. Further mixing was conducted at 150 degrees C. for one hour to obtain (A-2) an addition-cured silicone gel. The obtained (A-2) addition-cured silicone gel was found to have a penetration of 120 when measured using a ¼ cone according to ASTM D1403. Its viscosity could not be measured by a rotational viscometer (produced by SHIBAURA SYSTEMS CO., LTD.).

Preparation Example 3

(A1) 100 parts by weight of polydimethylsiloxane having a viscosity of 0.7 Pa·s and an average of one vinyl group positioned at only the terminal of the molecular chain, (A2) 0.7 part by weight (SiH group content of 8.8 mmol/g, SiH of (A2)/SiVi of (A1)=1.2) of a trimethylsilyl group-blocked dimethylsiloxane/methylhydrogensiloxane copolymer having a viscosity of 0.015 Pa·s, (A3) 0.02 part by weight (4 ppm as platinum amount) of a vinylsiloxane complex compound (platinum amount: 1.8%) of chloroplatinic acid, 0.02 part by weight of 3,5-dimethyl-1-hexyn-3-ol and 0.2 part by weight of triarylisocyanurate were added to a universal kneader and mixed homogeneously. Further mixing was conducted at 150 degrees C. for one hour to obtain (A-3) an addition-cured silicone gel. The obtained (A-3) addition-cured silicone gel was found to have a penetration of 100 when measured using a ¼ cone according to ASTM D1403. Its viscosity could not be measured by a rotational viscometer (produced by SHIBAURA SYSTEMS CO., LTD.).

Preparation Example 4

(A1) 100 parts by weight of polydimethylsiloxane having a viscosity of 0.7 Pa·s and an average of one vinyl group positioned at only the terminal of the molecular chain, (A2) 0.9 part by weight (SiH group content of 8.8 mmol/g, SiH of (A2)/SiVi of (A1)=1.5) of a trimethylsilyl group-blocked dimethylsiloxane/methylhydrogensiloxane copolymer having a viscosity of 0.015 Pa·s, (A3) 0.02 part by weight (4 ppm as platinum amount) of a vinylsiloxane complex compound (platinum amount 1.8%) of chloroplatinic acid, 0.02 part by weight of 3,5-dimethyl-1-hexyn-3-ol and 0.2 part by weight of triarylisocyanurate were added to a universal kneader and mixed homogeneously. Further mixing was conducted at 150 degrees C. for one hour to obtain (A-4) an addition-cured silicone gel. The obtained (A-4) addition-cured silicone gel was found to have a penetration of 70 when measured using a ¼ cone according to ASTM D1403. Its viscosity could not be measured by a rotational viscometer (produced by SHIBAURA SYSTEMS CO., LTD.).

Example 1

(A-1) 100 parts by weight of the addition-cured silicone gel obtained in Preparation Example 1 was put into a one-liter universal kneader. And (B-1) 262 parts by weight of aluminum oxide powder having an average particle diameter of 14 μm, (B-2) 262 parts by weight of aluminum oxide powder having an average particle diameter of 3 μm and (B-3) 131 parts by weight of zinc oxide powder having an average particle diameter of 0.5 μm were also added. They were mixed homogeneously to obtain a heat dissipating material. The heat dissipating material was measured for its properties, and the results were shown in Table 1.

Example 2

(A-2) 100 parts by weight of the addition-cured silicone gel obtained in Preparation Example 2 was put into a one-liter universal kneader. And (B-1) 262 parts by weight of aluminum oxide powder having an average particle diameter of 14 μm, (B-2) 262 parts by weight of aluminum oxide powder having an average particle diameter of 3 μm and (B-3) 131 parts by weight of zinc oxide powder having an average particle diameter of 0.5 μm were also added. They were mixed homogeneously to obtain a heat dissipating material. The heat dissipating material was measured for its properties, and the results were shown in Table 1.

Example 3

(A-3) 100 parts by weight of the addition-cured silicone gel obtained in Preparation Example 3 was put into a one-liter universal kneader. And (B-1) 262 parts by weight of aluminum oxide powder having an average particle diameter of 14 μm, (B-2) 262 parts by weight of aluminum oxide powder having an average particle diameter of 3 μm and (B-3) 131 parts by weight of zinc oxide powder having an average particle diameter of 0.5 μm were also added. They were mixed homogeneously to obtain a heat dissipating material. The heat dissipating material was measured for its properties, and the results were shown in Table 1.

Comparative Example 1

(A-4) 100 parts by weight of the addition-cured silicone gel obtained in Preparation Example 4 was put into a one-liter universal kneader. And (B-1) 200 parts by weight of aluminum oxide powder having an average particle diameter of 14 μm, (B-2) 200 parts by weight of aluminum oxide powder having an average particle diameter of 3 μm and (B-3) 130 parts by weight of zinc oxide powder having an average particle diameter of 0.5 μm were also added. They were mixed homogeneously to obtain a heat dissipating material. The heat dissipating material was measured for its properties, and the results were shown in Table 1.

Comparative Example 2

(A-5) 100 parts by weight of $C_{10}$ modified silicone oil having a viscosity of 0.7 Pa·s (penetration: unmeasurable), (B-1) 320 parts by weight of aluminum oxide powder having an average particle diameter of 14 μm, (B-2) 320 parts by weight of aluminum oxide powder having an average particle diameter of 3 μm and (B-3) 160 parts by weight of zinc oxide powder having an average particle diameter of 0.5 μm were added to a one-liter universal kneader. They were mixed homogeneously to obtain a heat dissipating material. The heat dissipating material was measured for its properties, and the results were shown in Table 1.

Comparative Example 3

(A-5) 100 parts by weight of $C_{10}$ modified silicone oil having a viscosity of 0.7 Pa·s (penetration: unmeasurable), (B-1) 700 parts by weight of aluminum oxide powder having an average particle diameter of 14 μm and (B-3) 400 parts by weight of zinc oxide powder having an average particle diameter of 0.5 μm were added to a one-liter universal kneader. They were mixed homogeneously to obtain a heat dissipating material. The heat dissipating material was measured for its properties, and the results were shown in Table 1.

TABLE 1

|  |  | Example 1 | Example 2 | Example 3 | Comparative Example 1 | Comparative Example 2 | Comparative Example 3 |
|---|---|---|---|---|---|---|---|
| Component (A) | | | | | | | |
| A-1: | Addition-cured silicone gel (penetration of 200) | 100 | — | — | — | — | — |
| A-2: | Addition-cured silicone gel (penetration of 120) | — | 100 | — | — | — | — |
| A-3: | Addition-cured silicone gel (penetration of 100) | — | — | 100 | — | — | — |
| A-4: | Addition-cured silicone gel (penetration of 70) | — | — | — | 100 | — | — |
| A-5: | $C_{10}$ modified silicone oil (0.7 Pa · s by rotational viscometer) | — | — | — | — | 100 | 100 |
| Component (B) | | | | | | | |
| B-1: | Aluminum oxide powder (average particle diameter of 14 μm) | 262 | 262 | 262 | 200 | 320 | 700 |
| B-2: | Aluminum oxide powder (average particle diameter of 3 μm) | 262 | 262 | 262 | 200 | 320 | — |
| B-3: | Zinc oxide powder (average particle diameter of 0.5 μm) | 131 | 131 | 131 | 130 | 160 | 400 |
| Unworked penetration | | 270 | 245 | 210 | 180 | 400 | 250 |
| Heat conductivity [W/m · k] | | 1.5 | 1.5 | 1.5 | 1.0 | 2.0 | 3.3 |
| Oil bleed distance [mm] | After one day | 0 | 0 | 0 | 0 | 7 | 5 |
| | After 10 days | 1 | 1 | 1 | 1 | 15 | 10 |
| | After 20 days | 3 | 3 | 1 | 1 | 20 | 12 |
| | After 30 days | 3 | 4 | 2 | 1 | 24 | 14 |

It is apparent from Table 1 that the individual Examples using the silicone gel cured by an addition reaction having a penetration of not less than 100 as the component (A) can obtain a heat dissipating material that exhibits very limited oil bleeding. Since high filling of the heat conductive filler is possible, excellent thermal conductivity can be exerted.

INDUSTRIAL APPLICABILITY

The heat dissipating material of the present invention is excellent in thermal conductivity and not prone to oil bleeding, so it is suitable as a heat conductive material to be interposed between the heat-generating electronic component and the heat dissipating body.

What is claimed is:
1. A method of producing a heat dissipating material which is interposed between a heat-generating electronic component and a heat dissipating body, comprising:
a step of mixing (A1) 100 parts by weight of polyorganosiloxane having an average of 0.1 to 2 alkenyl groups within each molecule, the alkenyl group being bonded to a silicon atom, (A2) an amount of polyorganohydrogensiloxane having two or more hydrogen atoms within each molecule, the hydrogen atom being bonded to a silicon atom that the silicon-bonded hydrogen atom is 0.3 to 1.5 mole per one of silicon-bonded alkenyl group of the component (A1), and (A3) a catalytic amount of a platinum based catalyst to form an addition-curable silicone gel composition, a step of heating the addition-curable silicone gel composition at 60 to 150 degrees C. for 30 to 180 minutes to cure, a step of adding (B) 500 to 2000 parts by weight of a heat conductive filler to (A) 100 parts by weight of the cured silicone gel and mixing.

2. The method of producing a heat dissipating material according to claim 1, wherein the cured silicone gel has a penetration (ASTM D1403, ¼ cone) of not less than 100.

3. The method of producing a heat dissipating material according to claim 1, wherein an unworked penetration at 23° C. of the heat dissipating material is in a range of 200 to 450.

* * * * *